United States Patent
Lyu et al.

(10) Patent No.: US 10,916,673 B2
(45) Date of Patent: Feb. 9, 2021

(54) SOLDER STRIP APPLIED TO SHINGLED SOLAR CELL MODULE

(71) Applicant: LONGI SOLAR TECHNOLOGY (TAIZHOU) CO., LTD., Jiangsu (CN)

(72) Inventors: Jun Lyu, Jiangsu (CN); Chen Zhu, Jiangsu (CN); Qiangzhong Zhu, Jiangsu (CN)

(73) Assignee: LONGI SOLAR TECHNOLOGY (TAIZHOU) CO., LTD., Jiangsu (CN)

( * ) Notice: Subject to any disclaimer, the term of this patent is extended or adjusted under 35 U.S.C. 154(b) by 0 days.

(21) Appl. No.: 16/645,232

(22) PCT Filed: Nov. 20, 2017

(86) PCT No.: PCT/CN2017/111825
§ 371 (c)(1),
(2) Date: Mar. 6, 2020

(87) PCT Pub. No.: WO2019/047374
PCT Pub. Date: Mar. 14, 2019

(65) Prior Publication Data
US 2020/0279966 A1    Sep. 3, 2020

(30) Foreign Application Priority Data
Sep. 7, 2017    (CN) .......................... 2017 1 0801896

(51) Int. Cl.
*H01L 31/05*    (2014.01)
(52) U.S. Cl.
CPC ...... *H01L 31/0512* (2013.01); *H01L 31/0508* (2013.01)
(58) Field of Classification Search
None
See application file for complete search history.

(56) References Cited

U.S. PATENT DOCUMENTS

| | | | | |
|---|---|---|---|---|
| 2014/0124014 | A1* | 5/2014 | Morad | ........... H01L 31/044 136/246 |
| 2015/0287850 | A1* | 10/2015 | Tai | ........... H01L 31/022425 136/256 |

FOREIGN PATENT DOCUMENTS

| | | |
|---|---|---|
| AU | 2017430968 B2 | 3/2019 |
| CN | 104332519 A | 2/2015 |

(Continued)

OTHER PUBLICATIONS

Extended European Search Report dated Aug. 4, 2020 for Application No. EP 17924556.8, 7 pages.
(Continued)

*Primary Examiner* — Magali P Slawski
(74) *Attorney, Agent, or Firm* — Nixon Peabody LLP

(57) ABSTRACT

The disclosure discloses a solder strip applied to a shingled solar cell module, including a flat portion, and an upper cell slice connecting portion and a lower cell slice connecting portion located at two sides of the flat portion; a plurality of fine grid lines are arranged in parallel on front/back surfaces of lower/upper cell slices; cutting directions of the lower cell slice and the upper cell slice are parallel to the fine grid lines; the solder strip is arranged perpendicular to the fine grid lines or parallel to busbars; and the upper cell slice partially overlaps with the lower cell slice, the flat portion is soldered to the fine grid lines/busbars on the front surface of the lower cell slice and the fine grid lines/busbars on the back surface of the upper cell slice to form an overlapped region, the upper cell slice connecting portion is soldered to the fine grid lines/busbars on the back surface of the upper cell slice, and the lower cell slice connecting portion is soldered to the fine grid lines/busbars on the front surface of the lower cell slice. The disclosure reduces a stress of a soldering point on a shingled solar cell of a MBB shingled solar cell module or a Smartwire shingled solar cell module under loading and (Continued)

temperature stresses, so that MBB and Smartwire technologies can be applied to the shingled solar cell module.

4 Claims, 3 Drawing Sheets

(56) References Cited

FOREIGN PATENT DOCUMENTS

| CN | 204361114 U | 5/2015 |
|----|-------------|--------|
| CN | 105576065 A | 5/2016 |
| CN | 106129162 A | 11/2016 |
| CN | 207021270 U | 2/2018 |
| KR | 20160052914 A | 5/2016 |

OTHER PUBLICATIONS

Malaysian Examination and Search Report dated Aug. 14, 2020 for Application No. PI2020001240, 3 pages.
ISR for PCT/CN2017/111825 dated May 8, 2018, 2 pages.
CN Search Report for CN 201710801896.7 filed Sep. 7, 2017, 2 pages.

* cited by examiner

SOLDER STRIP APPLIED TO SHINGLED SOLAR CELL MODULE

CROSS-REFERENCE TO RELATED APPLICATIONS

This application is the National Phase of International Application PCT/CN2017/111825, filed Nov. 20, 2017, which designated the United States. This application also includes a claim of priority under 35 U.S.C. § 119(a) and § 365(b) to Chinese Application No. 201710801896.7 filed Sep. 7, 2017, the entirety of which is hereby incorporated by reference.

FIELD OF TECHNOLOGY

The disclosure belongs to the field of photovoltaic module technologies, and more particularly, relates to a solder strip applied to a shingled solar cell module.

BACKGROUND

A shingled solar cell module is generally constructed by cutting a solar cell with a size of 156.75 mm*156.75 mm into small cell slices along a direction parallel to busbars, and arranging the small cell slices in series-parallel connection through conductive adhesive, which is as shown in FIG. 1. An internal area of the shingled solar cell module can be sufficiently utilized, and under the same area, the shingled solar cell module can accommodate more cell slice than a common module by 13%. Two aspects need to be considered for the shingled solar cell module: one aspect is that the automation of connecting the cell slices by the conductive adhesive is difficult; and the second aspect is that a current between cell slice is mainly collected through fine grid lines. As shown in FIG. 2, once the fine grid lines are fractured, a series resistance will be increased, thus increasing a power loss, especially in the case where adjacent fine grid lines are fractured.

It is expected by the inventor to reduce the power loss caused by the fine grid fracture risk via combining Multi-busbar (MBB) technology or a non-busbar (such as Smartwire) technology with a shingled solar cell technology, and meanwhile, the meshed connection of the solder strip and fine grids further reduces the series resistance of the module and improves the power of the module. At present, the MBB or Smartwire technology mainly solders 10 to 18 pieces of round solder strips having a diameter of about 300 μm with grid lines, of which the MBB technology mainly solders round solder strips 7 in parallel with busbars and the Smartwire technology mainly solders the round solder strips 7 perpendicularly to fine grid lines 6. As shown in FIGS. 3 and 4, the Smartwire technology requires two transparent polymers 8' to carry the round solder strips 7. FIG. 5 is a soldering schematic diagram which takes the Smartwire solder strip as an example to show that solder strip is combined with a shingled solar cell module. The main difficulty to apply the MBB or Smartwire technology to the shingled solar cell technology is that cell slices 1 are connected in series by the round solder strips 7, which will generate a large stress point at a soldering point in loading and temperature cycling tests, and are prone to cracking and other problems.

SUMMARY

The disclosure is intended to provide a solder strip applied to a shingled solar cell module, so as to solve one or more of the problems of difficult serial soldering of the shingled solar cell module: the first problem is that the automatic serial soldering requirement of the shingled solar cell module at current is high when the conductive adhesive is used for series connection, which cannot satisfy the required capacity for fast serial soldering; the second problem is more cracks under loading and temperature stresses generated when the MBB or Smartwire technology is combined with the shingled solar cell module; and the third problem is the power loss caused by the fine grid fracture of the shingled solar cell module.

In order to achieve the above object, the following technical solution is employed in the disclosure.

A solder strip applied to a shingled solar cell module includes a flat portion, and an upper cell slice connecting portion, and a lower cell slice connecting portion located at two sides of the flat portion; wherein, the solder strip is used for connecting a lower cell slice and an upper cell slice which form the shingled solar cell module; the shingled solar cell module is formed by solar cells without bus bar; a plurality of fine grid lines are arranged in parallel on a front surface of the lower cell slice, and a plurality of fine grid lines are arranged in parallel on a back surface of the upper cell slice; the fine grid lines on the front surface of the lower cell slice and the fine grid lines on the back surface of the upper cell slice are arranged in parallel; cutting directions of the lower cell slice and the upper cell slice are parallel to the fine grid lines; the solder strip is arranged perpendicular to the fine grid lines; and the upper cell slice partially overlaps the lower cell slice, the flat portion is soldered to the fine grid lines on the front surface of the lower cell slice and the fine grid lines on the back surface of the upper cell slice to form an overlapped region, the upper cell slice connecting portion is soldered to the fine grid lines on the back surface of the upper cell slice, and the lower cell slice connecting portion is soldered to the fine grid lines on the front surface of the lower cell slice.

Further, the upper cell slice connecting portion is in a shape of a round bar.

Further, the lower cell slice connecting portion is in a shape of a round bar.

Further, the flat portion is made of a round bar by stamping.

A solder strip applied to a shingled solar cell module includes a flat portion, and an upper cell slice connecting portion and a lower cell slice connecting portion located at two sides of the flat portion; wherein, the solder strip is used for connecting a lower cell slice and an upper cell slice which form the shingled solar cell module; the shingled solar cell module is formed by multi-busbar solar cells; a plurality of fine grid lines are arranged in parallel on a front surface of the lower cell slice, and a plurality of fine grid lines are arranged in parallel on a back surface of the upper cell slice; the fine grid lines on the front surface of the lower cell slice and the fine grid lines on the back surface of the upper cell slice are arranged in parallel; cutting directions of the lower cell slice and the upper cell slice are parallel to the fine grid lines; a plurality of busbars are further perpendicularly arranged on the plurality of fine grid lines on the front surface of the lower cell slice, and a plurality of busbars are further arranged on the plurality of fine grid lines on the back surface of the upper cell slice; the solder strip is parallel to one of the busbars; the flat portion is soldered to a busbar on the front surface of the lower cell slice and a busbar on the back surface of the upper cell slice to form an overlapped region, the upper cell slice connecting portion is soldered to the busbars on the back surface of the upper cell slice, and the lower cell slice connecting portion is soldered to the busbars on the front surface of the lower cell slice.

Further, the upper cell slice connecting portion is in a shape of a round bar.

Further, the lower cell slice connecting portion is in a shape of a round bar.

Further, the flat portion is made of a round bar by stamping.

A solder strip applied to a shingled solar cell module includes a flat portion, and an upper cell slice connecting portion and a lower cell slice connecting portion located at two sides of the flat portion, wherein the upper cell slice connecting portion and the lower cell slice connecting portion have a thickness greater than that of the flat portion.

Compared with the prior art, the disclosure has the following advantageous effects.

(1) Series connection methods of conventional shingled solar cell modules are expanded.

(2) A series soldering method for large-scale automatic mass production to improve a mass production rate of the shingled solar cell module is designed.

(3) The problem that more cracks under loading and temperature stresses are generated when the shingled solar cell module is combined with the MBB or Smartwire technology is solved.

The disclosure reduces a stress of a soldering point on a shingled solar cell of a MBB shingled solar cell module (MBB is combined with the shingled solar cell technology) or a Smartwire shingled solar cell module (Smartwire is combined with the shingled solar cell module) under loading and temperature stresses via a solder strip applied to a shingled solar cell module, so that the MBB and Smartwire technologies can be applied to the shingled solar cell module.

In the figures, 1 refers to upper cell slice; 2 refers to busbars on the back surface of the cell slice; 3 refers to conductive adhesive; 4 refers to busbars on the front surface of the cell slice; 5 refers to lower cell slice; 6 refers to fine grid lines; 7 refers to round solder strip; 8 refers to aluminum back surface field; 8' refers to a transparent polymer; 9 refers to flat portion; 10 refers to upper cell slice connecting portion; and 11 refers to lower cell slice connecting portion.

DESCRIPTION OF THE EMBODIMENTS

The disclosure is described in detail hereinafter with reference to the drawings and specific embodiments. It should be noted that data in the embodiments (such as a width and a number of fine grids, etc.) may be adjusted according to the actual situations.

Figure 1:
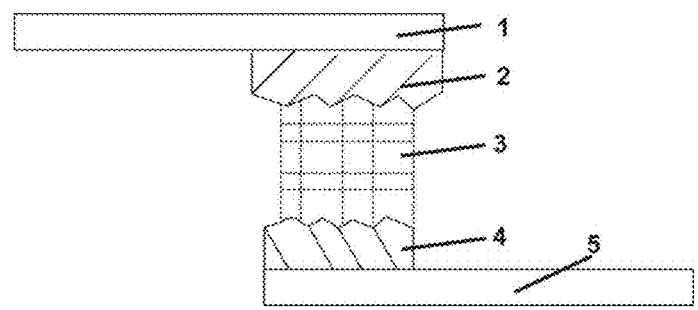
FIG. 1 is a structural diagram showing a connecting part of a current shingled solar cell technology.
Figure 2:
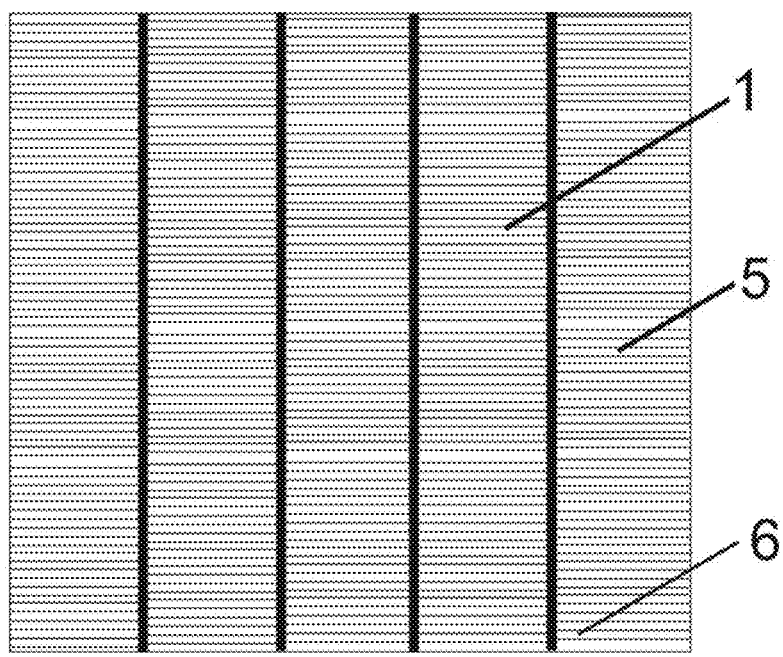
FIG. 2 is a schematic structural diagram of a cell of a current shingled solar cell module.
Figure 3:
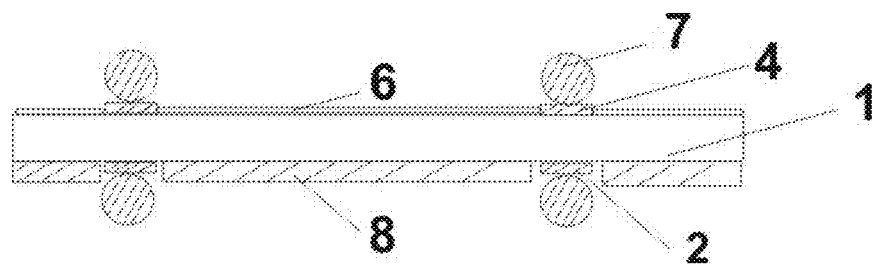
FIG. 3 is a soldering schematic diagram of a current MBB module.
Figure 4:
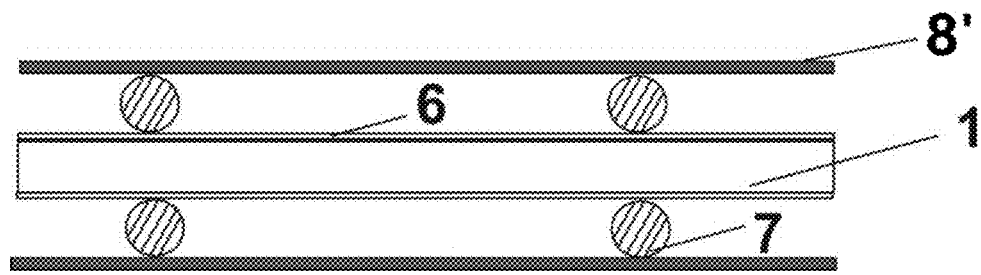
FIG. 4 is a soldering schematic diagram of a current Smartwire module.
Figure 5:
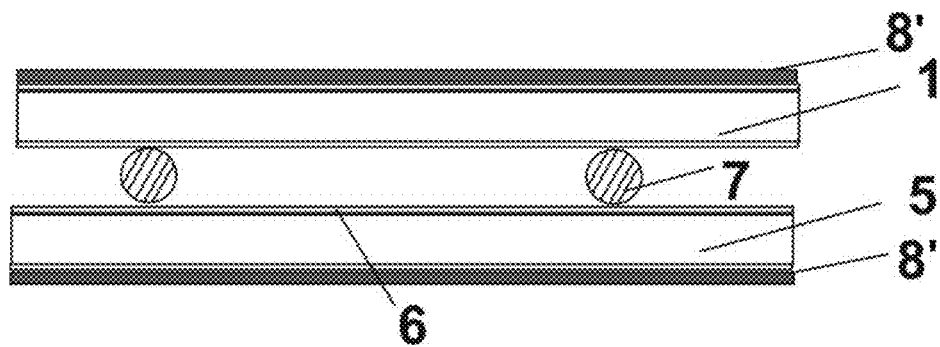
FIG. 5 is a soldering schematic diagram which takes the Smartwire solder strip as an example to show that a solder strip is combined with a shingled solar cell module.

In a non-busbar module, such as a Smartwire module, a round solder strip 7 is round having a size of about 300 μm, and is bonded to a cell slice through a transparent polymer film 8' that servers as a carrier, as shown in FIG. 4. During laminating, the solder strip is perpendicularly soldered to fine grid lines 6 via pressure and temperature to form excellent electrical properties. When a Smartwire technology is applied to a shingled solar cell technology, it is necessary to adjust a direction of the fine grid lines 6 so that the fine grid lines 6 are perpendicular to a direction of the solder strip. When a conventional Smartwire solder strip is used for shingled solar cell, the contact between the conventional Smartwire solder strip and the cell slice is point contact. In loading and thermal stress related tests, the conventional Smartwire solder strip suffers a very huge stress, which is prone to cracking and other problems, thus reducing the reliability of the module.

Figure 7:
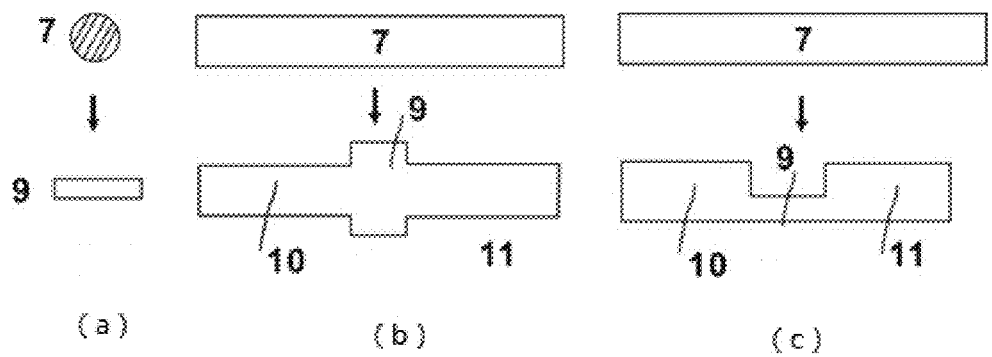
FIGS. 7(a) to 7(c) are schematic diagrams illustrating three different structures of Smartwire or MBB solder strips according to an embodiment of the disclosure.
Figure 8:
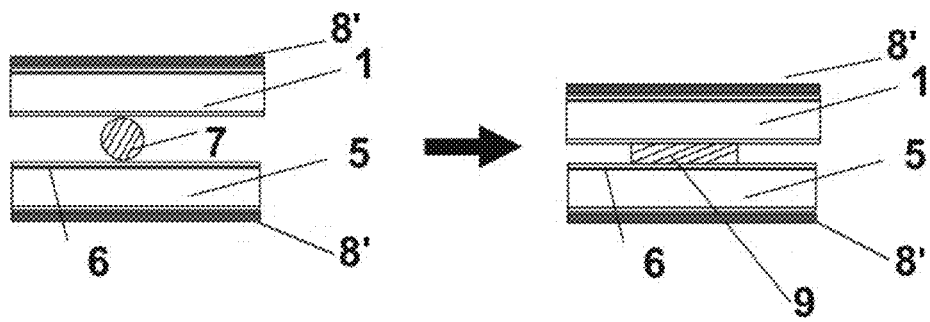
FIG. 8 is a schematic structure comparison diagram when the combination of a round solder strip with the shingled solar cell module is changed into the combination of the solder strip according to an embodiment of the disclosure with the shingled solar cell module.
Figure 9:
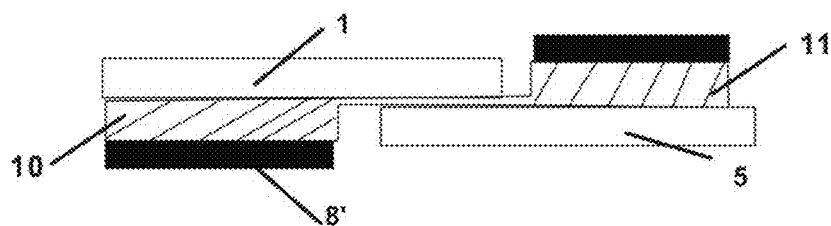
FIG. 9 is a schematic structural diagram which takes the Smartwire solder strip as an example to show that the solder strip is combined with the shingled solar cell module according to an embodiment of the disclosure.

The disclosure provides a solder strip applied to a shingled solar cell module, which adds a stamping step to a round solder strip 7 used by Smartwire technology in a series soldering process, so that the solder strip at the shingled solar cell is changed from round to rectangular to form a flat portion 9 (as shown in FIGS. 7(a) to 7(c)), thus greatly increasing a contact area between the solder strip and a cell slice, and reducing a crack risk of the solder strip, as shown in FIGS. 8 and 9. In the Smartwire shingled solar cell module, the solder strip may also play a role of current collection, which greatly reduces a power loss caused by grid fracture. Meanwhile, a Smartwire solder strip in a light-facing area of the cell (upper cell slice connecting portion and lower cell slice connecting portion at two sides of the flat portion) is round, which can reutilize light intensity to increase the power of the module.

Figure 6:
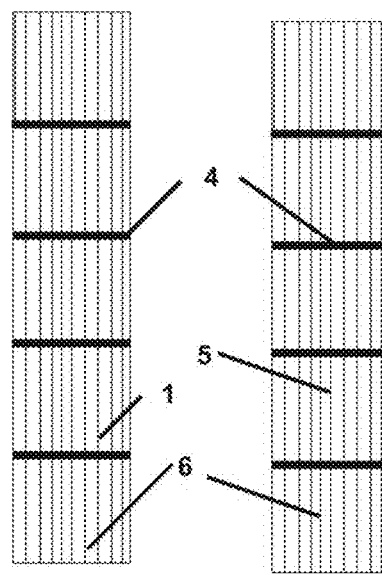
FIG. 6 is a schematic diagram of cell slices of Smartwire shingled solar cell modules and MBB shingled solar cell modules according to an embodiment of the present invention.

The cell slice of the disclosure is cut along a direction perpendicular to busbars of solar cells in MBB shingled solar cell module or parallel to fine grids of solar cells in Smartwire shingled solar cell module, which is as shown in FIG. 6.

The solder strip applied to a shingled solar cell module according to the disclosure includes a flat portion 9, an upper cell slice connecting portion 10 in a shape of a round bar and a lower cell slice connecting portion 11 in a shape of a round bar, the upper cell slice connecting portion 10 and the lower cell slice connecting portion 11 are respectively located at two sides of the flat portion 9; the upper cell slice connecting portion 10 and the lower cell slice connecting portion 11 are both connected with the flat portion 9, and the three are of an integrated structure.

According to the solder strip applied to a shingled solar cell module of the disclosure, a plurality of fine grid lines 6 are arranged in parallel on a front surface of the lower cell slice 5, and a plurality of fine grid lines 6 are arranged in parallel on a back surface of the upper cell slice 1. The fine grid lines 6 on the front surface of the lower cell slice 5 and the fine grid lines 6 on the back surface of the upper cell slice 1 are arranged in parallel. The solder strip is arranged perpendicular to the fine grid lines 6. The upper cell slice 1 partially overlaps the lower cell slice 5, and the flat portion 9 is soldered to the fine grid lines 6 on the front surface of the lower cell slice 5 and the fine grid lines 6 on the back surface of the upper cell slice to form an overlapped region. The upper cell slice connecting portion 10 is soldered to the fine grid lines on the back surface of the upper cell slice 1, and the lower cell slice connecting portion 11 is soldered to the fine grid lines 6 on the front surface of the lower cell slice 5.

If MBB is employed, a plurality of busbars 4 are further perpendicularly arranged on the plurality of fine grid lines 6 on the front surface of the lower cell slice 5, and a plurality of busbars 4 are further arranged on the plurality of fine grid lines 6 on the back surface of the upper cell slice 1. The solder strip is parallel to one of the busbars 4 (perpendicular to the fine grid lines 6). The upper cell slice 1 partially overlaps with the lower cell slice 5, and the flat portion 9 is soldered to a busbar 4 on the front surface of the lower cell slice 5 and a busbar 4 on the back surface of the upper cell slice to form an overlapped region. The upper cell slice connecting portion 10 is soldered to the busbars 4 on the back surface of the upper cell slice 1, and the lower cell slice connecting portion 11 is soldered to the busbars 4 on the front surface of the lower cell slice 5.

According to the disclosure, when cells are connected in series, the solder strip at the joint of the two cell slices are stamped to become flat, so that the contact area between the solder strip and the cell slice is increased, and the loading or temperature stress is reduced.

By adding a stamping device to a production line, the disclosure flattens a part of the solder strip by stamping, and carries out soldering, wherein a length of the solder strip needs to be greater than an overlapped length of the cells. In the Smartwire technology, a length of polymer used for carrying a solder strip needs to be shorter than the length of the solder strip so as to leave a region for stamping the solder strip (the disclosure protects the structural design of the solder strip, and is not limited to the designed solder strip by stamping).

What is claimed is:

1. A solder strip applied to a shingled solar cell module, comprising a flat portion (9), an upper cell slice connecting portion (10), and a lower cell slice connecting portion (11) located at two sides of the flat portion (9); wherein, the solder strip is used for connecting a lower cell slice (5) and an upper cell slice (1) which form the shingled solar cell module; the shingled solar cell module is formed by solar cells without busbar; a plurality of fine grid lines (6) are arranged in parallel on a front surface of the lower cell slice (5), and a plurality of fine grid lines (6) are arranged in parallel on a back surface of the upper cell slice (1); the fine grid lines (6) on the front surface of the lower cell slice (5) and the fine grid lines (6) on the back surface of the upper cell slice (1) are arranged in parallel; and cutting directions of the lower cell slice (5) and the upper cell slice (1) are parallel to the fine grid lines; and the solder strip is arranged perpendicular to the fine grid lines (6); and the upper cell slice (1) partially overlaps the lower cell slice (5), the flat portion (9) is soldered to the fine grid lines (6) on the front surface of the lower cell slice (5) and the fine grid lines (6) on the back surface of the upper cell slice to form an overlapped region, the upper cell slice connecting portion (10) is soldered to the fine grid lines (6) on the back surface of the upper cell slice (1), and the lower cell slice connecting portion (11) is soldered to the fine grid lines on the front surface of the lower cell slice (5).

2. The solder strip applied to a shingled solar cell module according to claim 1, wherein the upper cell slice connecting portion (10) is in a shape of a round bar.

3. The solder strip applied to a shingled solar cell module according to claim 1, wherein the lower cell slice connecting portion (11) is in a shape of a round bar.

4. The solder strip applied to a shingled solar cell module according to claim 1, wherein the flat portion (9) is made of a round bar by stamping.

* * * * *